(12) United States Patent
Low et al.

(10) Patent No.: US 6,429,534 B1
(45) Date of Patent: Aug. 6, 2002

(54) INTERPOSER TAPE FOR SEMICONDUCTOR PACKAGE

(75) Inventors: Qwai H. Low; Chok J. Chia; Maniam Alagaratnam, all of Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/478,972

(22) Filed: Jan. 6, 2000

(51) Int. Cl.[7] .......................... H01L 23/48; H01L 23/52; H01L 29/40; H01L 23/495
(52) U.S. Cl. ...................... 257/784; 257/700; 257/692; 257/695; 257/672; 257/676
(58) Field of Search ................................ 257/784, 698, 257/700, 692, 695, 672, 676, 747, 688, 776, 730; 438/106–127

(56) References Cited

U.S. PATENT DOCUMENTS

| | | | | |
|---|---|---|---|---|
| 5,138,430 A | * | 8/1992 | Gow, 3rd et al. ............. 357/70 |
| 5,168,345 A | * | 12/1992 | Brossart ...................... 257/668 |
| 5,332,864 A | * | 7/1994 | Liang et al. ................ 174/52.4 |
| 5,468,681 A | * | 11/1995 | Pasch ......................... 437/183 |
| 5,569,956 A | * | 10/1996 | Chillara et al. ............. 257/668 |
| 5,646,829 A | * | 7/1997 | Sota ........................... 361/813 |
| 6,124,546 A | * | 9/2000 | Hayward et al. .......... 174/52.2 |

* cited by examiner

Primary Examiner—Eddie Lee
Assistant Examiner—Jesse A. Fenty
(74) Attorney, Agent, or Firm—Beyer Weaver & Thomas, LLP

(57) ABSTRACT

Provided is an interposer tape which provides electrical communication between a die and a packaging substrate. The dimensions of the interposer tape may vary to accommodate a variety of die sizes for the same packaging substrate. The interposer tape includes an array of traces. A first set of wire bonds is formed between the array of traces and the die. A second set of wire bonds is formed between the array of traces and the packaging substrate.

20 Claims, 4 Drawing Sheets

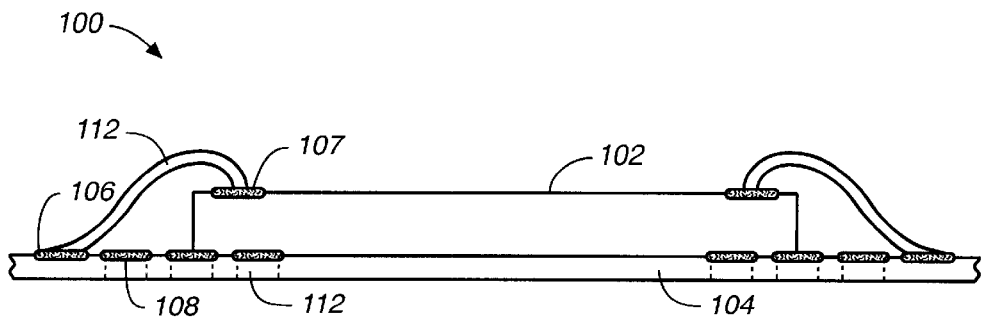
FIG._1A
(PRIOR ART)
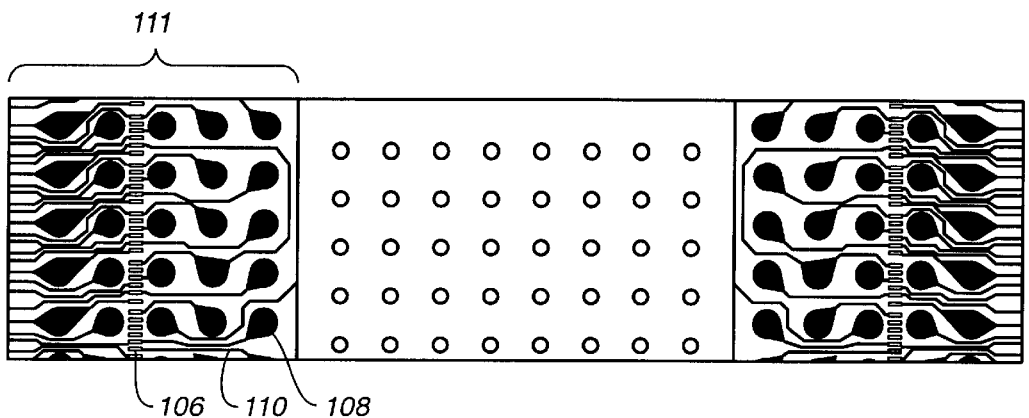
FIG._1B
(PRIOR ART)
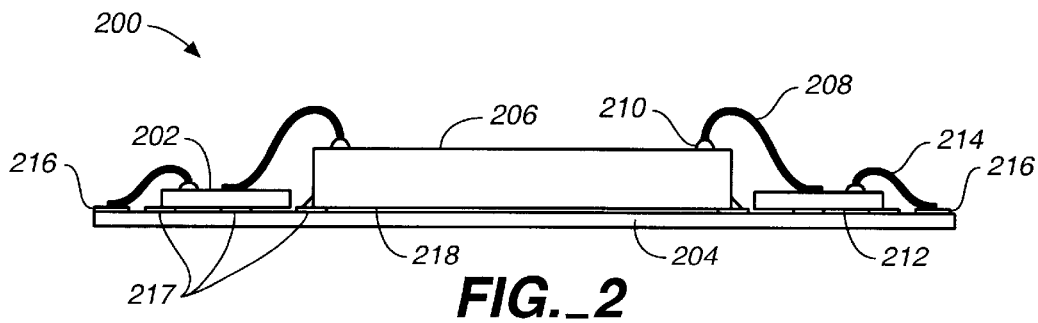
FIG._2

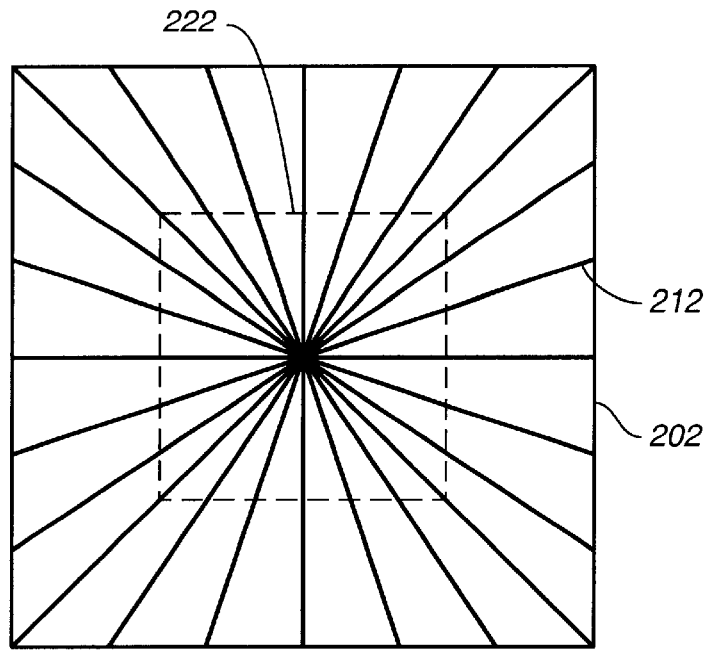
FIG._3A
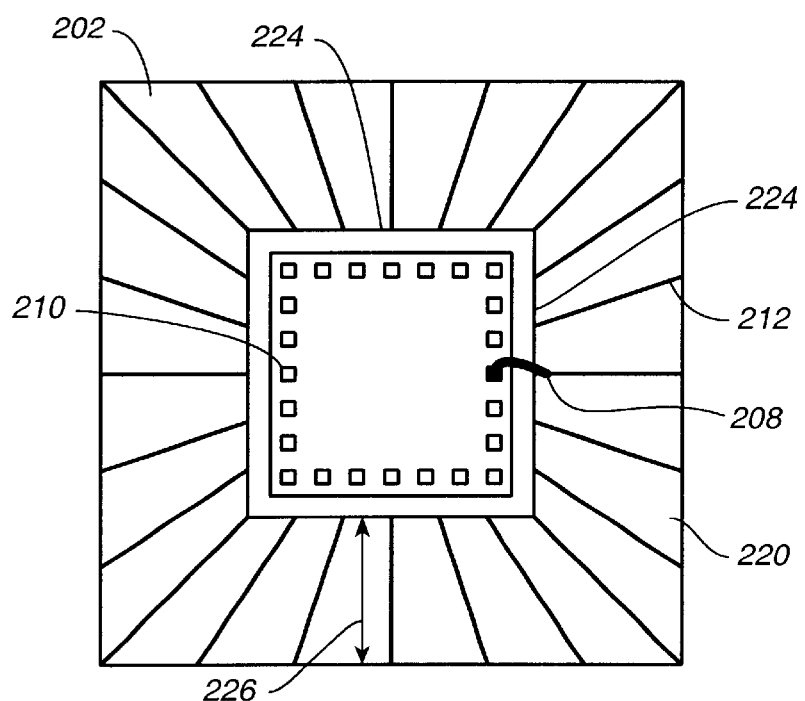
FIG._3B

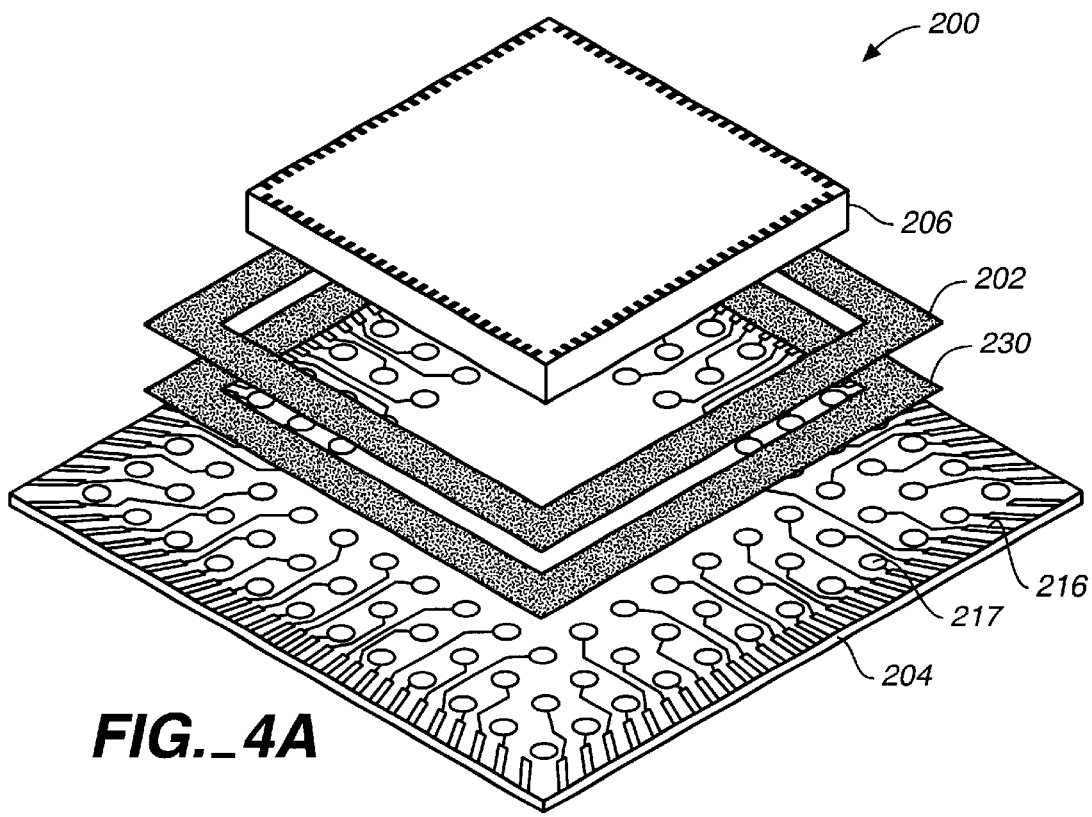
FIG._4A
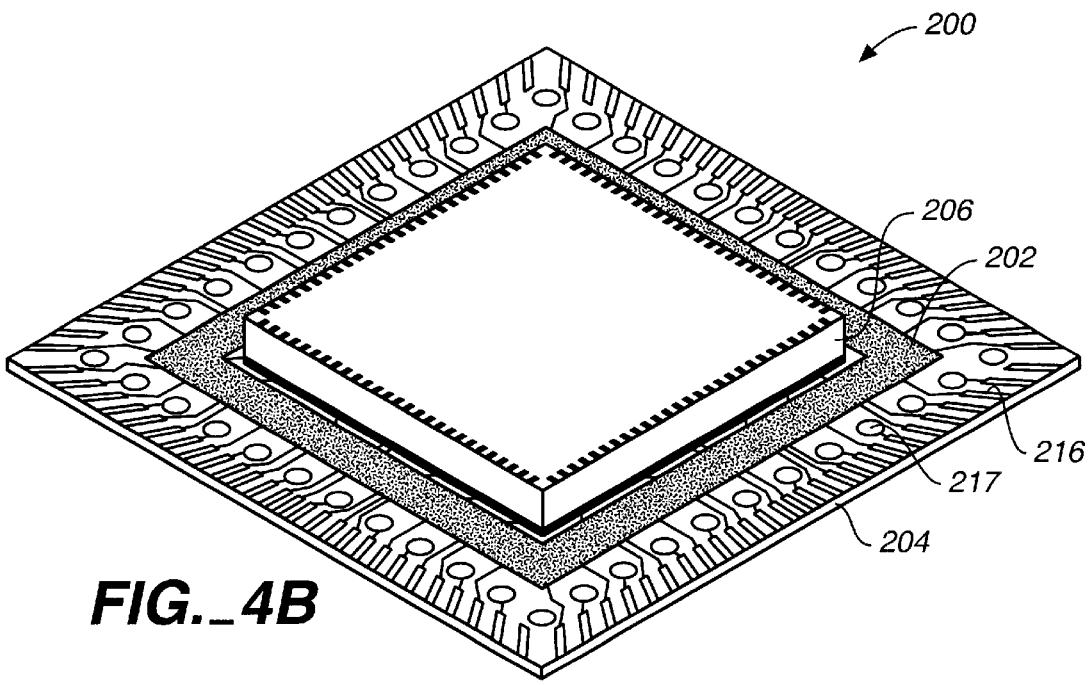
FIG._4B

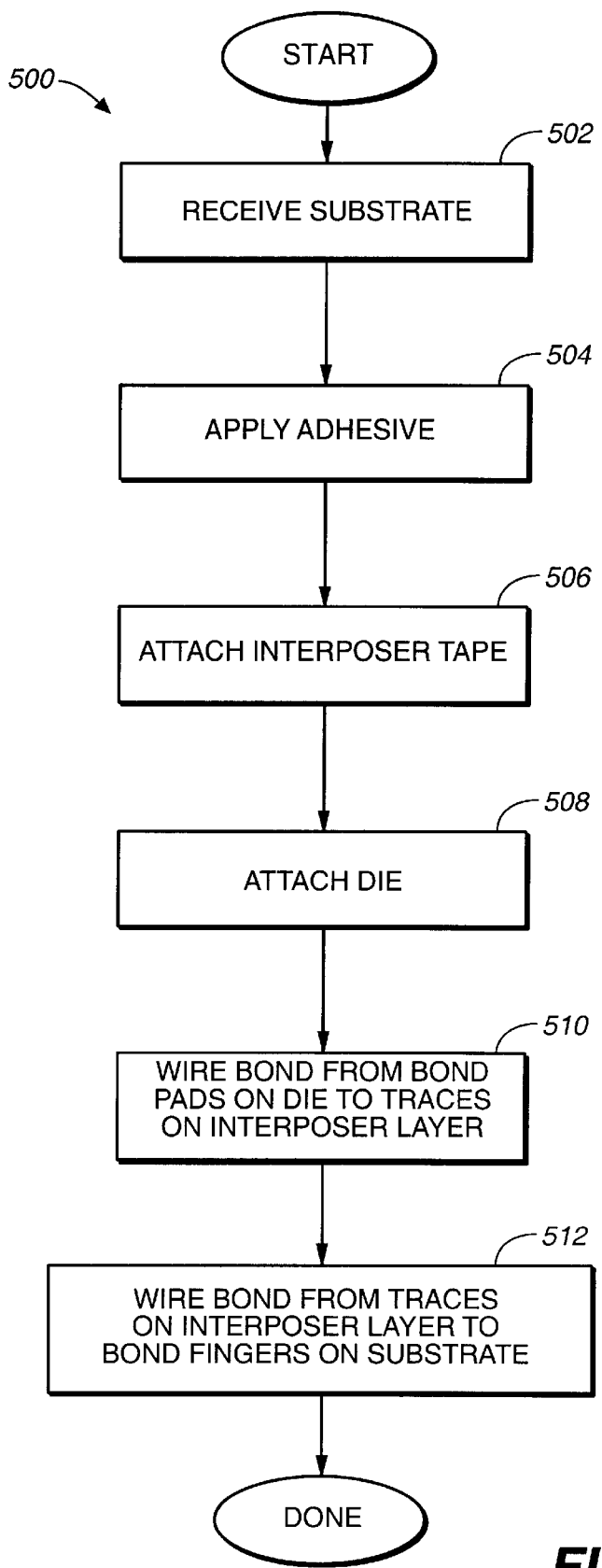
FIG._5

INTERPOSER TAPE FOR SEMICONDUCTOR PACKAGE

BACKGROUND OF THE INVENTION

This invention relates generally to semiconductor chip device packages and assembly. More specifically, the invention relates to an interposer tape for a tape ball grid array package which permits varying sized dies to be used for the same package.

In semiconductor design and assembly, an integrated circuit chip or "die" may be bonded to a tape substrate before connection to a board. FIG. 1A illustrates a conventional tape ball grid array (TBGA) package 100. The conventional TBGA package 100 has a die 102 mounted upon a tape 104. The tape 104 includes bond fingers 106 for wire bonding to bond pads 107 of the die 102. The bond fingers 106 are connected to ball attach sites 108 via connecting metal traces 110 (FIG. 1B). The ball attach sites 108 coincide with holes 112 which are used for attaching solder balls to the conventional TBGA package 100. The solder balls permit external communication, i.e. to a mother board.

Often, it is desirable to change the size of the die 102 for the conventional TBGA package 100. For the tape 104, the size of the die 102 is limited to a range of sizes. For smaller dies, this limitation is determined by the length of bond wires 112 which extend from the die 102 to the bond fingers 106. More specifically, during injection of an encapsulating plastic, long bond wires 112 are likely to bend, contact each other and short out. This phenomenon is known as "sweep" and limits the length of bond wires 112. As a result, to substantially decrease the size of the die 102, a new tape 104 is typically required.

The metal traces 110, the bond fingers 106 and the ball attach sites 108 form an interconnect pattern 111 as illustrated in FIG. 1B. In the past, to overcome sweep and permit a smaller die 102, designers have opted to alter the interconnect pattern 111. One. interconnect pattern 111 approach has been to move the bond fingers 106 towards the die 102. However, this solution is limited by the width of the metal traces 110 and the. density of the interconnect pattern 111. More specifically, conventional routing limitations dictate that a maximum of three or less metal traces 110 may be placed between two adjacent ball attach sites 108. More than three metal traces 110 placed between two adjacent ball attach sites 108 may compromise the mechanical strength and manufacturability of the tape 104. As a result, the bond fingers 106 may not extend close enough to the die 102 to allow manageable wire bond lengths to connect to the bond pads 107. Correspondingly, the size of the die 102 remains limited for the tape 104.

Thus, the length of the wire bonds 112 and the interconnect pattern 111 limit the size of the die 102 which can be used for the tape 104. If the die 102 size is changed, such that it is outside the range of the bond wires 112, a new tape must be designed and manufactured. As a result, this requires the design of multiple tapes for different die sizes. Each new tape increases cost and time consumption in design and manufacturing. In addition, it also quite common that different size dies also change the interconnect pattern 111, which necessitates a new tape and increases costs for the package 100. Further, in some cases, the allowable wire length for the wire bonds 112 and interconnect pattern 111 routability may limit the minimum size of the die 102.

In view of the foregoing, a package which may accommodate multiple die sizes and small die sizes would be desirable.

SUMMARY OF THE INVENTION

To achieve the foregoing, the present invention provides an interposer tape which provides electrical communication between a die and a packaging substrate. The interposer tape permits multiple die sizes to be used for the substrate. More specifically, the dimensions of the interposer tape may vary to accommodate a variety of die sizes for the substrate. The interposer tape includes an array of traces. The array of traces provide electrical communication between bond pads of the die and bond fingers of the substrate. A first set of wire bonds may be formed between the array of traces and the bond pads of the die. A second set of wire bonds may be formed between the array of traces and the bond fingers of the substrate.

In one aspect, the invention provides a semiconductor package. The semiconductor package includes a packaging substrate. The semiconductor package also includes an interposer tape mechanically bound to the packaging substrate and in electrical communication with the packaging substrate. The semiconductor package further includes a die mechanically bound to the substrate and in electrical communication with the interposer tape, wherein the interposer tape provides electrical communication between the substrate and the die.

In another aspect, the invention relates to an interface between a die and a packaging substrate. The interface includes an interface substrate. The interface also includes an array of conductive links, wherein the array of conductive links are adapted to fitting a plurality of die sizes to the packaging substrate.

In yet another aspect, the invention provides a method of fabricating a semiconductor package. The method includes providing a packaging substrate. The method also includes mechanically binding an interposer tape to the substrate, the interposer tape including an array of conductive links. The method further includes mechanically binding a die to the substrate. The method additionally includes forming a first set of wire bonds between the interposer tape and the die. The method also includes forming a second set of wire bonds between the interposer tape and the substrate.

These and other features and advantages of the present invention are described below with reference to the drawings.

BRIEF DESCRIPTION OF THE DRAWINGS

FIG. 1A illustrates a diagrammatic side view of a conventional tape ball grid array (TBGA) package.

FIG. 1B illustrates a top view of a section of a conventional TBGA tape.

FIG. 2 illustrates a diagrammatic side view of a semiconductor package including an interposer tape in accordance with one embodiment of the present invention.

FIG. 3A illustrates an interposer tape including a radial array of traces in accordance with one embodiment of the present invention.

FIG. 3B illustrates the interposer tape of FIG. 3A after being cut in accordance with one embodiment of the present invention.

FIGS. 4A and 4B illustrate prospective views of the package of FIG. 2 before and after assembly respectively.

FIG. 5 provides a flowchart for a method of fabricating the semiconductor package of FIG. 2 in accordance with the present invention.

DETAILED DESCRIPTION OF PREFERRED EMBODIMENTS

Reference will now be made in detail to preferred embodiments of the invention. Examples of preferred embodiments are illustrated in the accompanying drawings. While the invention will be described in conjunction with these preferred embodiments, it will be understood that it is not intended to limit the invention to any particular preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

FIG. 2 illustrates a diagrammatic side view of a semiconductor package 200 including an interposer tape 202 in accordance with one embodiment of the present invention. The semiconductor package 200 also includes a substrate 204 mechanically bonded to a die 206. Rather than the conventional wire bonding from the die 206 to the substrate 204, the semiconductor package 200 includes two sets of wire bonds.

A first set of bond wires 208 are bonded from bond pads 210 on the die 206 to traces 212 on the interposer tape 202. The traces 212 are conductive links traversing the interposer tape 202. A second set of bond wires 214 are bonded from the traces 212 of the interposer tape 202 to bond fingers 216 of the substrate 204. Thus, the traces 212, first set of bond wires 208 and the second set of bond wires 214 electrically connect the die 206 to the substrate 204.

Typically, the substrate 204 is designed for the semiconductor package 200. In the preferred embodiment, the substrate 204 has bond fingers 216 near the outermost portion (i.e. the perimeter) of the substrate 204. In this manner, the substrate 204 may accommodate the largest die for the semiconductor package 200. To accommodate a smaller die than the largest that the substrate 204 can handle, the interposer tape 202 is used. The interposer tape 202 is adhered or laminated to the top surface 218 of the substrat 204.

As illustrated in FIG. 3A, the interposer tape 202 has an array of traces 212. In a preferred embodiment, the traces 212 on the interposer tape 202 are in a radial pattern and extend from a center region 222 towards the periphery 220 of the interposer tape 202. As illustrated in FIG. 3B, the center region 222 of the interposer tape 202 may be removed to accommodate the die 206. More specifically, the interposer tape 202 may be cut or punched based on the size of the die 206. After removing the center region 222, the die 206 may be placed within the center region 222.

The space between traces 212 may be flexibly controlled. For the radial pattern of FIG. 3A, the space between traces 212 increases as the size of the center region 224 increases. In other words, the space between traces 212 increases as the size of the die 206 increases. In one embodiment, the space between traces 212 on the inner edge 224 of the cut interposer tape 202 may be matched to the spacing between bond pads 210 on the die 206. Thus, the interposer tape 202 may be cut such that the space between traces 212 on the inner edge 224 correlate to the spacing between bond pads 210. In this manner, the interposer tape 202 may be mass produced and then subsequently cut to size for a particular die 206 and substrate 204.

The traces 212 are not limited to the radial pattern and may include any arrangement on the interposer tape 202. In one embodiment, the arrangement of traces 212 is designed relative to the layout of the bond fingers 216 on the substrate 204. The number of traces may range widely. In one embodiment, the number of traces 212 is matched to the number of the bond pads 210 of die 206. In another embodiment, the number of traces 212 is matched to the number of the bond fingers 216 of substrate 204. Typically, the number of traces 212 is equal to or less than the number of bond fingers 216 for substrate 204.

It is important to note that all of the traces 212 need not be used when implementing the interposer tape 202. In other words, some of the traces 212 may not be connected to the die 206 and the substrate 204. Thus, to accommodate a die having only a subset of bond pads 210 relative to the number of traces 212, some traces 212 may not be used. By way of example, if the substrate 204 is a tape ball grid array (TBGA) package having rows of five ball attach sites 217, the substrate may have 280 ball attach sites 217. Thus, according to the radial array of the interposer tape 202 of FIG. 3A, the traces 212 may be evenly spaced at every 1.29 degrees. However, the die 206 may only include 260 bond pads 210 and require 260 wire bonds 208. Correspondingly, in this case, twenty of the traces 212 may not be used.

Based on length of the traces between the first set of bond wires 208 and the second set of bond wires 214, the wire bonds may be formed in one stage or two. More specifically, for a small width 226, a wire bond from the first set of bond wires 208 may be continued to the second set of bond wires 214. In contrast, for a large width 226, the first and the second set of bond wires 208 and 214 may be separate and shorter while the traces 212 span a large distance between the die 206 and the base tape 204. In this case, the shorter bond wires 208 and 214 facilitate high speed manufacturing.

In one embodiment, the interposer tape 202 is a thin flexible plastic. By way of example, Kapton is well suited for the present invention. The interposer tape 202 may include a metal layer over the plastic layer. The metal layer may be etched to form the traces 212. Thus, in this case, the traces 212 are metal and embedded in the interposer tape 202. However, the traces 212 are not limited to metal and may be any suitably conductive material. For the semiconductor package 200, the thickness of the interposer tape 202 may range from 25 to 70 microns. Preferably, the material of the interposer tape 202 is lightweight to keep the weight of the semiconductor package 200 to a minimum. Correspondingly, the present invention is well suited for lightweight and compact systems, such as portable electronic devices.

FIGS. 4A and 4B illustrate prospective views of the package 200 before and after assembly respectively. FIG. 4A illustrates the bond fingers 216 on the perimeter of the substrate 204. Generally speaking, the bond fingers 216 are leads or landings on the substrate 204 suitably sized to receive a wire bond. By way of example, the bond fingers 216 may be a metal pad large enough to land one of the second set of bond wires 214. The bond fingers 216 are further electrically connected to ball attach sites 217 for external communication with the substrate 204 (and die 206).

The package 200 includes an adhesive 230 for adhering the interposer tape 202 to the substrate 204. The amount, geometry and type of the adhesive 230 may vary. In one embodiment, the interposer tape 202 is pre-cut based on a known geometry of the die 206 and thus the adhesive 230 applied according to the pre-cut interposer tape 202. In another embodiment, the adhesive 230 is pre-applied to the interposer tape 202 and punched out together with the center region 222.

FIG. 5 provides a flowchart 500 for a method of fabricating a semiconductor package in accordance with one embodiment of the present invention. Processes in accordance with the present invention may include up to several additional steps not described or illustrated here in order not to obscure the present invention.

The flowchart 500 starts by receiving a substrate (502). The substrate may be a base tape included in a tape ball grid array package, for example. An adhesive is then applied to the substrate (504). The interposer tape is then mounted on the adhesive (506). In one embodiment, the interposer tape is pre-cut based on a known geometry of the die. More specifically, the interposer tape is punched before assembly in the flowchart 500. Typically, the traces are already formed on the interposer tape (e.g. by etching).

The die is then attached to the substrate in the center region of the interposer tape (508). Attaching the die may also include the application of an adhesive. The first set of wire bonds are then formed from the bond pads of the die to the traces of the interposer tape (510). If the distance between the first set of wire bonds and the second set of wire bonds is short, the first set of wire bonds may not be severed while making the wedge bond and thus continued to form the second set of wire bonds. Otherwise, the second set of wire bonds are subsequently formed from a second portion of the traces to the bond fingers (512). In addition, an encapsulation material may be subsequently added to protect the semiconductor package.

The present invention is suitable for use with any semiconductor package having a die to be electrically connected to a substrate. In particular, the present invention is well suited to accommodate multiple die sizes for a tape ball grid array package. By including the interposer tape between the die and the packaging substrate, the distance between the die and the leads of the packaging substrate may be substantially varied for a particular packaging substrate. In addition, by placing the interposer tape over the top surface of the substrate, the present invention permits access from the die to the bond fingers without concern for interference with the ball attach sites.

Advantageously, the present invention allows die sizes to be altered for a given base tape without designing a new base tape. In other words, a single package and substrate may be designed to accommodate multiple die sizes. In addition, the single package may use the same interconnect scheme on the substrate for the multiple die sizes. Thus, an interposer tape in accordance with the present invention provides a cost-effective alternative to altering the package substrate (e.g., the base tape). To change the size of the die for a package, the interposer tape is altered instead of the entire base tape or substrate. This reduces the cost of making the package when using multiple dies of varying sizes. Thus, the present invention may provide a lower cost and more flexible semiconductor package.

Although the foregoing invention has been described in some detail for purposes of clarity of understanding, it will be apparent that certain changes and modifications may be practiced within the scope of the appended claims. By way of example, the center region of an interposer tape need not be removed. In this case, the die may be attached to the upper surface of the interposer tape. In addition, the present invention is not restricted to substrates having bond fingers near the perimeter of a packaging substrate. Alternatively, some of the bond fingers may be located between the ball attach sites. It should be noted that there are many alternative ways of implementing both the process and apparatuses of the present invention.

Accordingly, the present embodiments are to be considered as illustrative and not restrictive, and the invention is not to be limited to the details given herein, but may be modified within the scope and equivalents of the appended claims.

What is claimed is:

1. A semiconductor package, comprising:

a packaging substrate;

an interposer tape mechanically bound to said packaging substrate and in electrical communication with said packaging substrate, wherein said interposer tape has a constructed configuration adaptable to accommodate a plurality of die sizes; and a die mechanically bound to said substrate and in electrical communication with said interposer tape, wherein said interposer tape provides electrical communication between said substrate and said die.

2. The semiconductor package of claim 1, wherein said interposer tape is sized to said die.

3. The semiconductor package of claim 2, wherein said interposer tape comprises an edge that is cut to size for said die.

4. The semiconductor package of claim 1, wherein said interposer tape includes an array of traces.

5. The semiconductor package of claim 4, wherein said array of traces are radially arranged.

6. The semiconductor package of claim 4, wherein the number of traces in the array of traces is matched to the number of bond pads on said die.

7. The semiconductor package of claim 1, wherein said interposer tape is wire bonded to said die using a first set of wire bonds.

8. The semiconductor package of claim 7, wherein said interposer tape is wire bonded to said packaging substrate using a second set of wire bonds.

9. The semiconductor package of claim 8, wherein at least one of said second set of wire bonds and at least one of said first set of wire bonds are the same wire.

10. The semiconductor package of claim 1, wherein said packaging substrate is a base tape.

11. The semiconductor package of claim 1, wherein said packaging substrate is included in a tape ball grid array package.

12. The semiconductor package of claim 1, further including an adhesive between said interposer tape and said packaging substrate.

13. The semiconductor package of claim 1, wherein the interposer comprises a center region that may be removed to accommodate said die.

14. An interface between a die and a packaging substrate, the interface comprising:

an interface substrate; and an array of conductive links, wherein said array of conductive links has a constructed configuration adaptable to accommodate a plurality of die sizes.

15. The interface of claim 14, wherein said array of conductive links are metal.

16. The interface of claim 14, wherein said interface comprises an edge that is cut to size.

17. The interface of claim 14, wherein said array of conductive links are formed by etching a conductive layer.

18. A semiconductor package, comprising:

a packaging substrate;

an interposer tape mechanically bound to said packaging substrate and in electrical communication with said packaging substrate, wherein said interposer has a constructed configuration adaptable to accommodate a plurality of die sizes, and said interposer tape includes an array of traces, wherein the space between individual traces on an inner edge of the interposer tape is substantially matched to the spacing between bond pads on the die for any size of the die; and a die mechanically bound to said substrate and in electrical communication with said interposer tape, wherein said interposer tape provides electrical communication between said substrate and said die.

19. The interface of claim 14, wherein the space between the array of conductive links on the inner edge of the interposer tape increases as the size of the die increases.

20. The interface of claim 14, wherein the space between individual links on an inner edge of the interposer tape is substantially matched to the spacing between bond pads on the die for any size of the die.

* * * * *